(12) United States Patent
Mathew et al.

(10) Patent No.: US 12,510,307 B2
(45) Date of Patent: Dec. 30, 2025

(54) HEAT SINK AND HEAT EXCHANGER SYSTEM USING THE SAME

(71) Applicant: UNITED ARAB EMIRATES UNIVERSITY, Al Ain (AE)

(72) Inventors: Bobby Mathew, Al Ain (AE); Fadi Alnaimat, Al Ain (AE); Mouza Abdulla Mohammed Sultan Al Shamsi, Al Ain (AE)

(73) Assignee: UNITED ARAB EMIRATES UNIVERSITY, Al Ain (AE)

( * ) Notice: Subject to any disclaimer, the term of this patent is extended or adjusted under 35 U.S.C. 154(b) by 0 days.

(21) Appl. No.: 18/645,708

(22) Filed: Apr. 25, 2024

(65) Prior Publication Data

US 2025/0334353 A1    Oct. 30, 2025

(51) Int. Cl.
*F28F 1/40*     (2006.01)
*H05K 7/20*    (2006.01)

(52) U.S. Cl.
CPC ........... *F28F 1/40* (2013.01); *H05K 7/20254* (2013.01)

(58) Field of Classification Search
CPC ... F28F 1/40; H05K 7/20327; H05K 7/20336; H05K 7/20254; H01L 23/473; H01L 23/4735; H01L 23/46
See application file for complete search history.

(56) References Cited

U.S. PATENT DOCUMENTS

| 4,450,896 A | 5/1984 | Opitz et al. |
| 4,909,315 A * | 3/1990 | Nelson ................ H01L 23/4336 165/185 |
| 7,597,135 B2 | 10/2009 | Ghosh et al. |
| 7,753,108 B2 * | 7/2010 | Lai ........................ H01L 23/473 165/80.4 |

(Continued)

FOREIGN PATENT DOCUMENTS

| EP | 1772903 A2 | 4/2007 |
| WO | 9934412 A2 | 7/1999 |
| WO | 2009085307 A2 | 7/2009 |

OTHER PUBLICATIONS

Mustaffar, et al. "Concentric annular heat pipe characterisation analysis for a drying application." Applied Thermal Engineering 149 (2019): 275-286.

*Primary Examiner* — Gordon A Jones
(74) *Attorney, Agent, or Firm* — Nath, Goldberg & Meyer; Joshua B. Goldberg (57) ABSTRACT

The heat sink is a single-phase liquid-based heat sink. The heat sink includes a hollow cylindrical housing having first and second opposed circular walls and a sidewall. The first circular wall has a central opening formed therethrough. An intermediate circular plate is positioned between the first and second opposed circular walls. The intermediate circular plate has a central passage and an array of apertures formed therethrough. An inlet tube with opposed first and second ends passes through the central opening. The second end of the inlet tube is in fluid communication with the central (Continued)

passage formed through the intermediate circular plate. An outlet tube with opposed first and second ends is also provided such that the second end thereof is in fluid communication with the central opening formed through the first circular wall. The second circular wall is adapted for thermal communication with a heat source.

12 Claims, 6 Drawing Sheets

(56) References Cited

U.S. PATENT DOCUMENTS

| | | | |
|---|---|---|---|
| 8,944,151 B2 * | 2/2015 | Flotta | H05K 7/20772 |
| | | | 165/80.4 |
| 8,981,556 B2 | 3/2015 | Joshi et al. | |
| 9,074,825 B2 * | 7/2015 | Satou | F28D 15/0266 |
| 9,151,544 B2 * | 10/2015 | Hwang | F28D 15/00 |
| 9,345,169 B1 * | 5/2016 | Campbell | H05K 7/20327 |
| 12,016,157 B2 * | 6/2024 | Malouin | H01L 23/4735 |

\* cited by examiner

HEAT SINK AND HEAT EXCHANGER SYSTEM USING THE SAME

BACKGROUND

Field

The disclosure of the present patent application relates to heat sinks, and particularly to a circular, single-phase liquid-based heat sink.

Description of Related Art

Heat sinks are passive heat exchangers that transfer the heat generated by heat source, such as a microprocessor or other device, to a fluid medium where the heat is dissipated away from the device, thereby allowing regulation of the device's temperature. For semiconductor devices used in a variety of consumer and industrial electronics, thermal resistance is the primary consideration in the design of heat sinks. The heat flow between the semiconductor die and the ambient air (or other heat exchange fluid) is modeled as a series of resistances to heat flow; e.g., there is a resistance from the die to the device case, from the device case to the heat sink, and from the heat sink to the ambient air. The sum of these resistances is the total thermal resistance from the die to the ambient air. Thermal resistance is defined as temperature rise per unit of power, analogous to electrical resistance, and is expressed in units of degrees Celsius per watt (° C./W). If the device dissipation in watts is known, and the total thermal resistance is calculated, the temperature rise of the die over the ambient air can be calculated. In the case of indirect cooling techniques, there is a need to minimize the thermal resistance of the heat exchanger.

Cooling approaches are typically categorized based on the type of heat exchange fluid (or "coolant"), particularly the choice of air or a liquid. Air-based cooling systems benefit from the abundant availability of air and, as such, are less complex than liquid-based cooling systems. Moreover, with air there is little concern of damage to microelectronics because of any physical contact therebetween. Liquid-based cooling systems are more complex than air-based cooling systems because of the finite supply of liquid in the necessarily closed system. However, liquids are better heat transfer fluids than air due to their superior thermophysical properties. The heat transfer coefficient of liquids is usually higher than that of air because the thermal conductivity of liquids is, in most cases, an order of magnitude greater than that of air. Additionally, the density of liquids is greater than that of air, thus minimizing the amount of coolant volume required for a constant mass flow rate. However, the primary drawback of liquid coolants is that they have a higher viscosity than air, resulting in an associated pressure drop which will always be greater than that of air.

Liquid-based electronic cooling systems can also be categorized into single and two-phase cooling systems. In single phase cooling systems, the liquid coolant does not undergo a phase change, while in two-phase cooling systems the liquid coolant undergoes a phase change. Phase change is a complex process, thus the advantage of single-phase cooling systems is that they are simpler in their construction and easier to operate when compared against two-phase cooling systems. Two-phase cooling systems have the ability to keep the microelectronic chip at a constant temperature because phase change is a constant temperature process. Another advantage of two-phase cooling systems is a lower mass flow rate requirement, which is related to the fact that the enthalpy associated with phase change is significantly greater than the specific heat capacity of any liquid coolant.

One of the most commonly used heat exchangers employed for indirect cooling of microelectronic chips is the single-coolant heat sink. The heat flow through the heat sink is by conduction while the heat flow from the heat sink to the coolant is by convection, thus the thermal resistances associated with these two modes of heat transfer are in series in the case of a typical heat sink. Among the two thermal resistances, the convection thermal resistance is dominant. Convection thermal resistance is dependent on the heat transfer surface area and the heat transfer coefficient. Earlier attempts at reducing convection thermal resistance of heat sinks involved increasing the heat transfer surface area, while later attempts at the same involved enhancing the heat transfer coefficient. Increasing heat transfer surface area is straightforward but the disadvantage of this approach is the increase in size of the heat sink. Enhancing the heat transfer coefficient is more complex and primarily requires altering the structure of the flow passage. However, this is not always associated with an increase in overall size of the heat sink, thus it is a preferred approach for reducing convection thermal resistance.

Approaches for enhancing the heat transfer coefficient are classified as either "passive" or "active". Passive techniques do not require external power, while active techniques require external power in order to enhance the heat transfer coefficient. Regardless of the category of enhancement technique, enhancement involves disrupting the boundary layer which, in turn, leads to thinning of the boundary layer as well as the creation of secondary flows. The overall effect of the disruption of the boundary layer is to improve the uniformity of the bulk temperature of the fluid, as well as lowering the wall temperature.

Passive techniques often involve the use of non-straight flow passages, as well as integrating obstacles in the flow passages. These lead to the disruption of the boundary layer, thus enhancing the heat transfer coefficient. Reduction in the hydraulic diameter of the flow passage is also a passive approach for enhancing the heat transfer coefficient. The reduction in the hydraulic diameter of the flow passage leads to thinning of the boundary layer which, in turn, leads to an increase in the heat transfer coefficient. A common example of this technique is the microchannel heat sink.

The three thermal resistances associated with heat sinks include conduction thermal resistance, convective thermal resistance, and caloric thermal resistance. Conduction thermal resistance represents the thermal resistance to heat flow through the heat sink structure, convection thermal resistance represents the thermal resistance to heat flow across the interface between the heat sink structure and the coolant, and caloric thermal resistance represents the thermal resistance experienced by the coolant between its inlet and outlet. The caloric thermal resistance represents the "ease" with which temperature of the coolant rises. The conduction thermal resistance can be reduced by constructing the heat sink from materials of high thermal conductivity along with a high conduction shape factor. The convection thermal resistance can be reduced by either increasing the heat transfer coefficient or the surface area of the interface between the heat sink and the coolant. The caloric thermal resistance can be reduced by increasing the mass flow rate of the coolant or by employing coolants with high specific heat capacities.

Employing microchannels in heat sinks has the advantage of enhancing the heat transfer coefficient. The heat transfer coefficient is inversely proportional to the hydraulic diameter of the flow passage, thus the heat transfer coefficient associated with microchannels is much higher than that of conventional flow passages. Further, the reduction in the size of the flow passages leads to an increase in the associated surface area density. The surface area density of a flow passage is the ratio of its surface area to its volume, and a higher surface area density implies a greater heat transfer surface area for a specific volume of the coolant. Moreover, the reduction in the size of the flow passage allows for reducing the substrate thickness and this, in turn, reduces the thermal conduction resistance.

Although the various techniques discussed above are effective in extracting heat from various heat sources, such heat sinks are often difficult to manufacture and, due to the delicacy of the components on the micro-scale, often suffer from maldistribution of the coolant as it flows through the heat sink. Further, a conventional microscale heat sink can experience a rate of temperature increase which can be difficult and/or energy intensive to manage. Thus, a heat sink and a heat exchanger system using the same solving the aforementioned problems are desired.

SUMMARY

The heat sink is a single-phase liquid-based heat sink. The heat sink includes a hollow cylindrical housing having first and second opposed circular walls and a sidewall. The first circular wall has a central opening formed therethrough. An intermediate circular plate is positioned between the first and second opposed circular walls. The intermediate circular plate has a central passage and an array of apertures formed therethrough. An inlet tube with opposed first and second ends passes through the central opening formed through the first circular wall. The second end of the inlet tube is in fluid communication with the central passage formed through the intermediate circular plate. An outlet tube with opposed first and second ends is also provided such that the second end thereof is in fluid communication with the central opening formed through the first circular wall. The second circular wall is adapted for thermal communication with a heat source.

The inlet tube is adapted to deliver a heat exchange liquid to a heat exchange chamber defined between the second circular wall and the intermediate circular plate. The outlet tube is adapted to remove the heat exchange liquid from an outlet chamber defined between the first circular wall and the intermediate circular plate. The outlet tube may have a greater diameter than the diameter of the inlet tube such that the inlet and the outlet tube may be coaxial. The heat exchange chamber and the outlet chamber are in fluid communication with one another through the array of apertures formed through the intermediate circular plate.

It should be understood that the heat sink may be manufactured using any suitable technique. Non-limiting examples of such manufacturing techniques include standard microfabrication (e.g., photolithography followed by dry etching of silicon dioxide and silicon and bonding) and 3D-printing.

In use, cool heat exchange liquid is delivered into the heat exchange chamber by the inlet tube, through the central passage formed through the intermediate circular plate. The second circular wall is in communication with a heat source, such as through direct contact, convective communication, radiative communication, etc., such that heat from the heat source can be transferred to the heat exchange liquid. The cool heat exchange liquid enters the heat exchange chamber from the center of the heat sink and flows radially towards the outer edge of the second circular wall. The circular/cylindrical shape of the heat sink allows for even flow distribution across the entire second circular wall. The second circular wall is formed from a thermally conductive material, such as silicon, aluminum, copper, stainless steel or any other suitable material. The heated heat exchange liquid flows through the array of apertures formed through the intermediate circular plate and into the outlet chamber. The array of apertures is formed near, or at, the outer circumferential edge. Within the outlet chamber, the heated heat exchange fluid flows radially inward toward the center of the heat sink. The heated heat exchange liquid is then extracted from the outlet chamber through the outlet tube.

Additional flow-disturbing elements may be mounted on an interior surface of the second circular wall in order to disturb the flow of the heat exchange liquid (and the rate of thermal transfer thereto) within the heat exchange chamber. Disturbance of the flow will lead to enhancement of the heat transfer coefficient which will in turn reduce convection thermal resistance ($R_{th,conv}$). Non-limiting examples of such flow-disturbing elements include circular-shaped pin fins, square-shaped pin fins, diamond-shaped pin fins, ellipse-shaped pin fins, linear elongated members defining a plurality of channels therebetween, zig-zag-shaped elongated members defining a plurality of channels therebetween, and serpentine-shaped elongated members defining a plurality of channels therebetween. In an embodiment these flow-disturbing elements can also be mounted on an interior surface of the first circular wall.

The heat sink may be integrated into a heat exchanger system including an air-to-liquid heat exchanger. An inlet of the air-to-liquid heat exchanger is in fluid communication with the outlet tube of the heat sink for receiving the heated heat exchange liquid therefrom for cooling thereof. An outlet of the air-to-liquid heat exchanger is in fluid communication with the inlet tube of the heat sink for transferring the cool heat exchange liquid thereto following cooling thereof. A pump or the like may be provided for driving the heat exchange liquid through the air-to-liquid heat exchanger, and a fan or the like may be provided for delivering environmental air to the air-to-liquid heat exchanger.

These and other features of the present subject matter will become readily apparent upon further review of the following specification.

DETAILED DESCRIPTION

Figure 1:
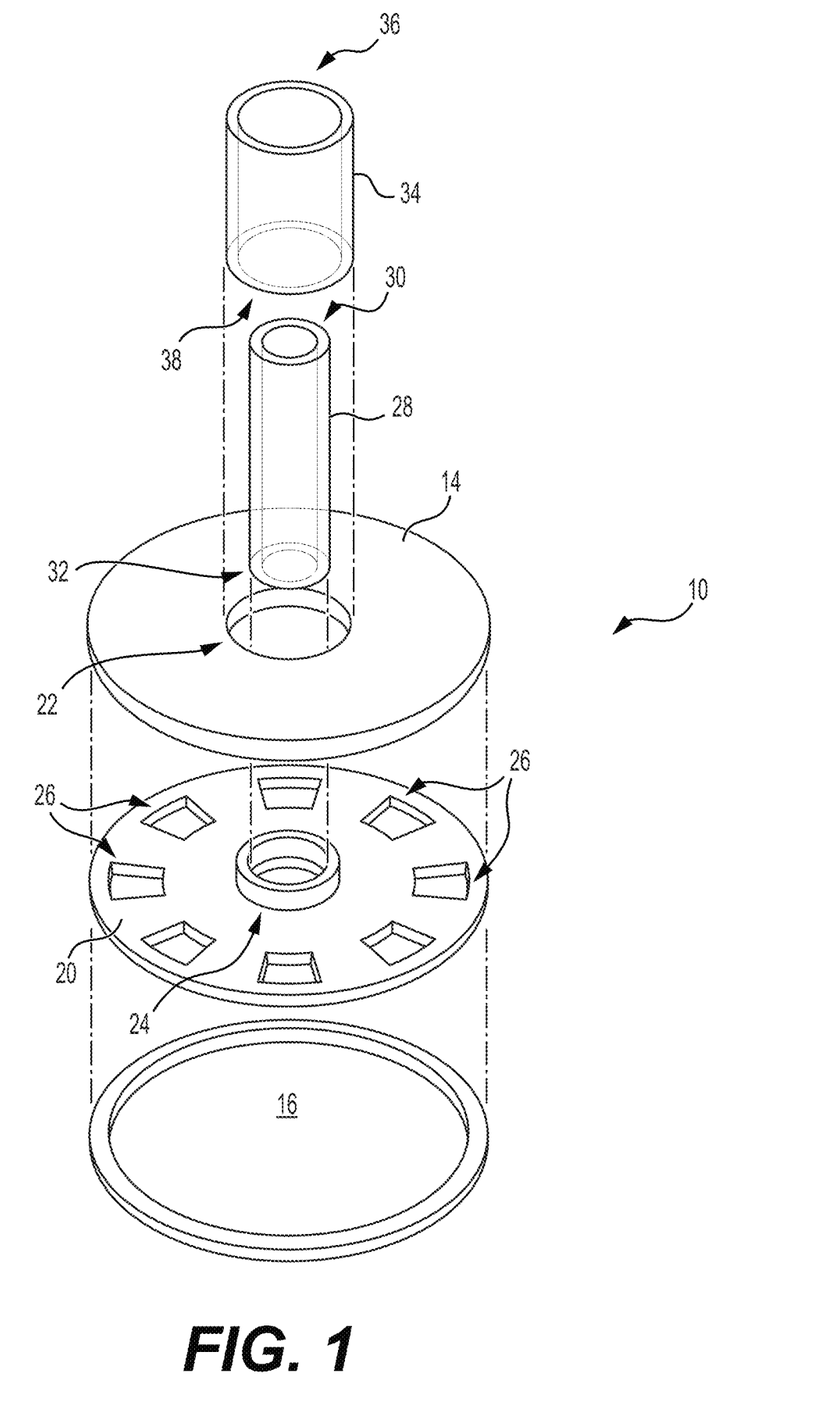
FIG. 1 is an exploded perspective view of the heat sink.
Figure 2:
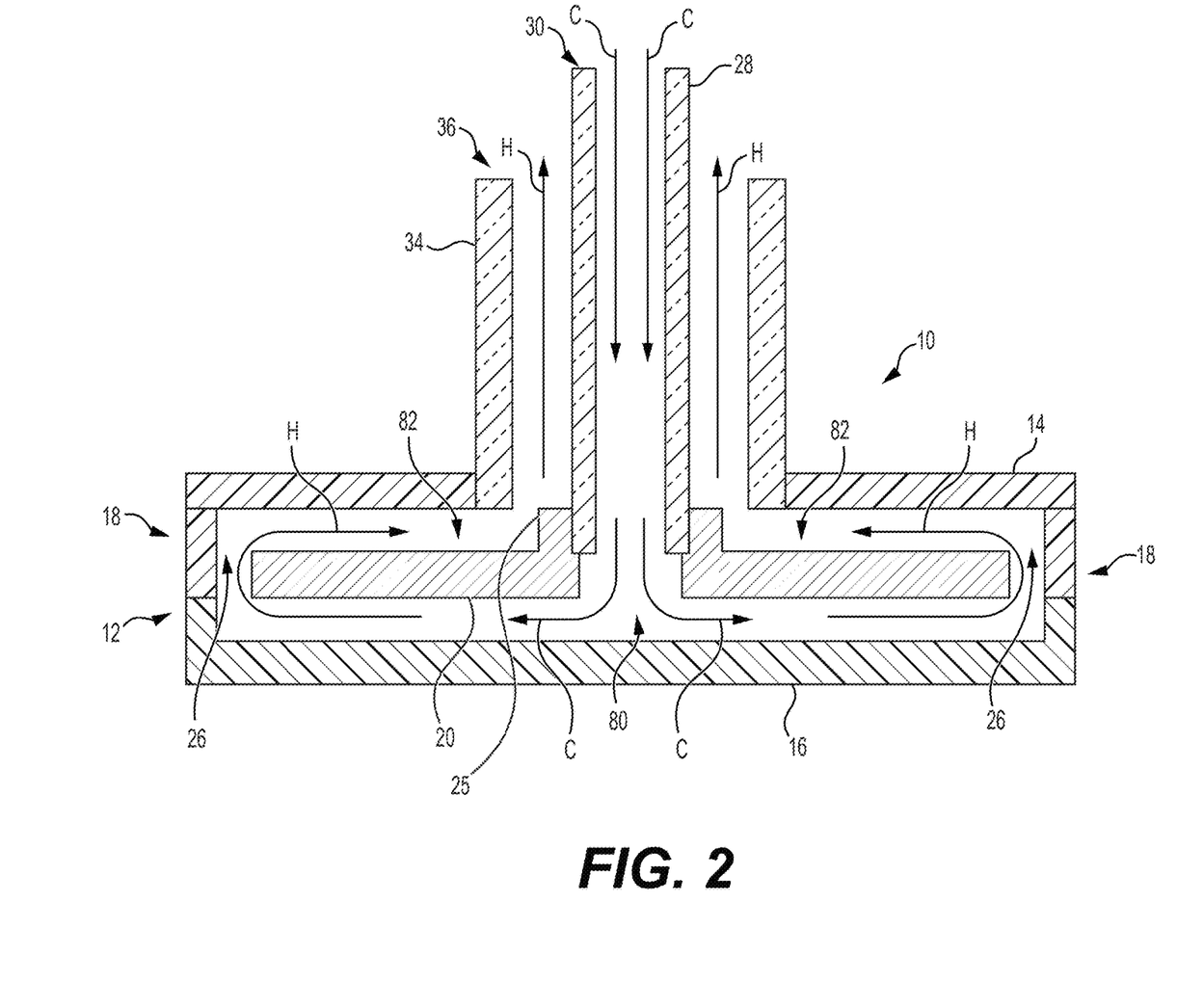
FIG. 2 is a side view in section of the heat sink.

Referring now to FIGS. 1 and 2, the heat sink 10 includes a hollow cylindrical housing 12 having first and second opposed circular walls 14, 16, respectively, and a sidewall 18. It should be understood that the relative dimensions of the hollow cylindrical housing 12 are shown for exemplary purposes only. The first circular wall 14 has a central opening 22 formed therethrough. As shown, the central opening 22 may be circular. It should be understood that the diameter of central opening 22 with respect to the diameter of first circular wall 14 is shown for exemplary purposes only. An intermediate circular plate 20 is positioned between the first and second opposed circular walls 14, 16. The intermediate circular plate 20 has a central passage 24 and an array of apertures 26 formed therethrough. It should be understood that the relative thickness of intermediate circular plate 20, the diameter of central passage 24 with respect to the outer diameter of intermediate circular plate 20, and the number, shape and relative positioning of the apertures 26 are shown for exemplary purposes only.

An inlet tube 28 with opposed first and second open ends 30, 32 passes through the central opening 22 formed through the first circular wall 14. The second open end 32 of the inlet tube 28 is in fluid communication with the central passage 24 formed through the intermediate circular plate 20. As best shown in FIG. 2, a rim 25 may be formed about central passage 24 and the second end of inlet tube 28 may be attached thereto. An outlet tube 34 with opposed first and second open ends 36, 38, respectively, is also provided such that the second end 38 is in fluid communication with the central opening 22 formed through the first circular wall 14. The second circular wall 16 is adapted for thermal communication with a heat source, such as a microprocessor or the like.

The heat sink 10 is a single-phase liquid-based heat sink and the inlet tube 28 is adapted to deliver a heat exchange liquid to a heat exchange chamber 80 defined between the second circular wall 16 and the intermediate circular plate 20. In FIG. 2, the relatively cool heat exchange liquid is indicated as "C". The outlet tube 34 is adapted to remove the heat exchange liquid from an outlet chamber 82 defined between the first circular wall 14 and the intermediate circular plate 20. In FIG. 2, the heated heat exchange liquid is indicated as "H". As shown, the outlet tube 34 may have a greater diameter than the diameter of the inlet tube 28 such that the inlet tube 28 and the outlet tube 34 may be coaxial. The heat exchange chamber 80 and the outlet chamber 82 are in fluid communication with one another through the array of apertures 26 formed through the intermediate circular plate 20.

In use, the cool heat exchange liquid C is delivered into the heat exchange chamber 80 by the inlet tube 28, through the central passage 24 formed through the intermediate circular plate 20. The second circular wall 16 is in communication with a heat source, such as through direct contact, convective communication, radiative communication, etc., such that heat from the heat source can be transferred to the heat exchange liquid. The cool heat exchange liquid C enters the heat exchange chamber 80 from the center of the heat sink 10 and flows radially towards the outer edge of the second circular wall 16. The circular/cylindrical shape of the heat sink 10 allows for even flow distribution across the entire second circular wall 16. The second circular wall 16 is formed from a thermally conductive material, such as silicon, aluminum, copper, stainless steel or any other suitable material. The heated heat exchange liquid H flows through the array of apertures 26 formed through the intermediate circular plate 20 and into the outlet chamber 82. The array of apertures 26 are formed near, or at, the outer circumferential edge. Within the outlet chamber 82, the heated heat exchange fluid H flows radially inward toward the center of the heat sink 10. The heated heat exchange liquid H is then extracted from the outlet chamber 82 through the outlet tube 34.

Since the inlet tube 28 and the outlet tube 34 are coaxial and positioned at the center of the cylindrical heat sink 10, uniform flow of the heat exchange liquid in all radial directions is achieved. The distance between the inlet tube 28 and the outlet tube 34 is effectively the same irrespective of the radial direction, thus the flow is uniform at any particular radius. This uniform flow avoids the creation of "hot spots"; i.e., spikes in temperature. Further, since the heat exchange fluid enters and leaves the heat sink 10 at its center, the temperature rise in any radial direction is approximately half of that of a straight-channel heat sink. The reduction in the temperature rise reduces the thermal stress experienced by the microelectronic chip.

Figure 3A:
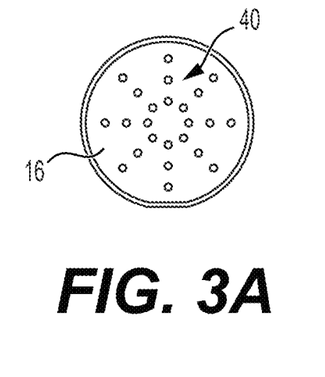
FIG. 3A, FIG. 3B, FIG. 3C, FIG. 3D, FIG. 3E, FIG. 3F and FIG. 3G show alternative embodiments of an interior surface of a second circular wall of the heat sink, each showing a different set of flow-distributing elements mounted thereon.
Figure 3B:
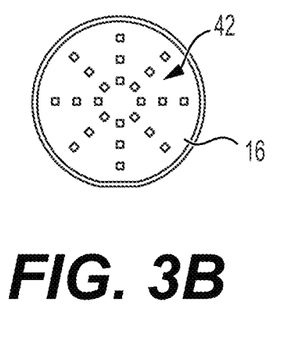
Figure 3C:
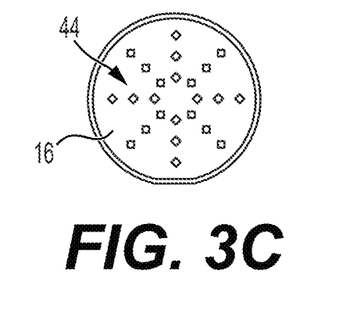
Figure 3D:
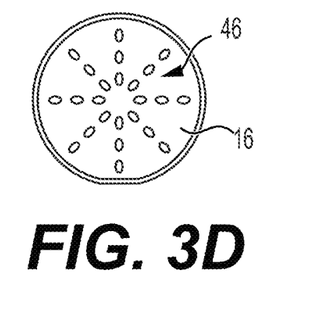
Figure 3E:
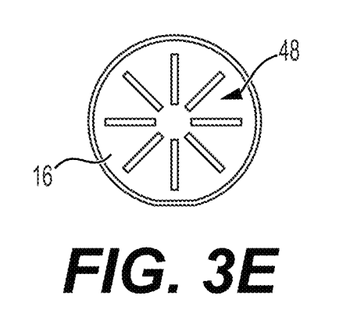
Figure 3F:
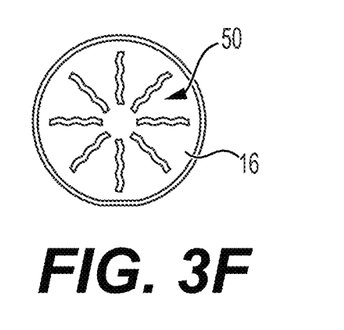
Figure 3G:
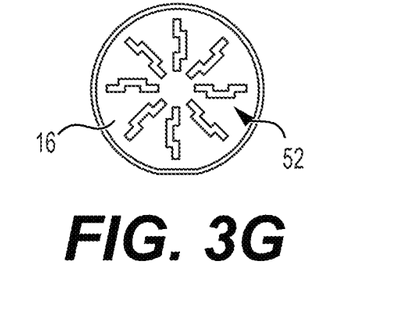

As shown in FIGS. 3A-3G, additional flow-disturbing elements may be mounted on an interior surface of the second circular wall 16 in order to evenly distribute the flow of the heat exchange liquid (and the rate of thermal transfer thereto) within the heat exchange chamber 80. Non-limiting examples of such flow-distributing elements include circular-shaped pin fins 40 (FIG. 3A), square-shaped pin fins 42 (FIG. 3B), diamond-shaped pin fins 44 (FIG. 3C), ellipse-shaped pin fins 46 (FIG. 3D), linear elongated members 48 defining a plurality of channels therebetween (FIG. 3E), zig-zag-shaped elongated members 50 defining a plurality of channels therebetween (FIG. 3F), and serpentine-shaped elongated members 52 defining a plurality of channels therebetween (FIG. 3G). It should be understood that the number, positioning, relative dimensions of and overall configuration and shape of the additional flow-distributing elements shown in FIGS. 3A-3G are shown for exemplary purposes only.

Figure 4A:
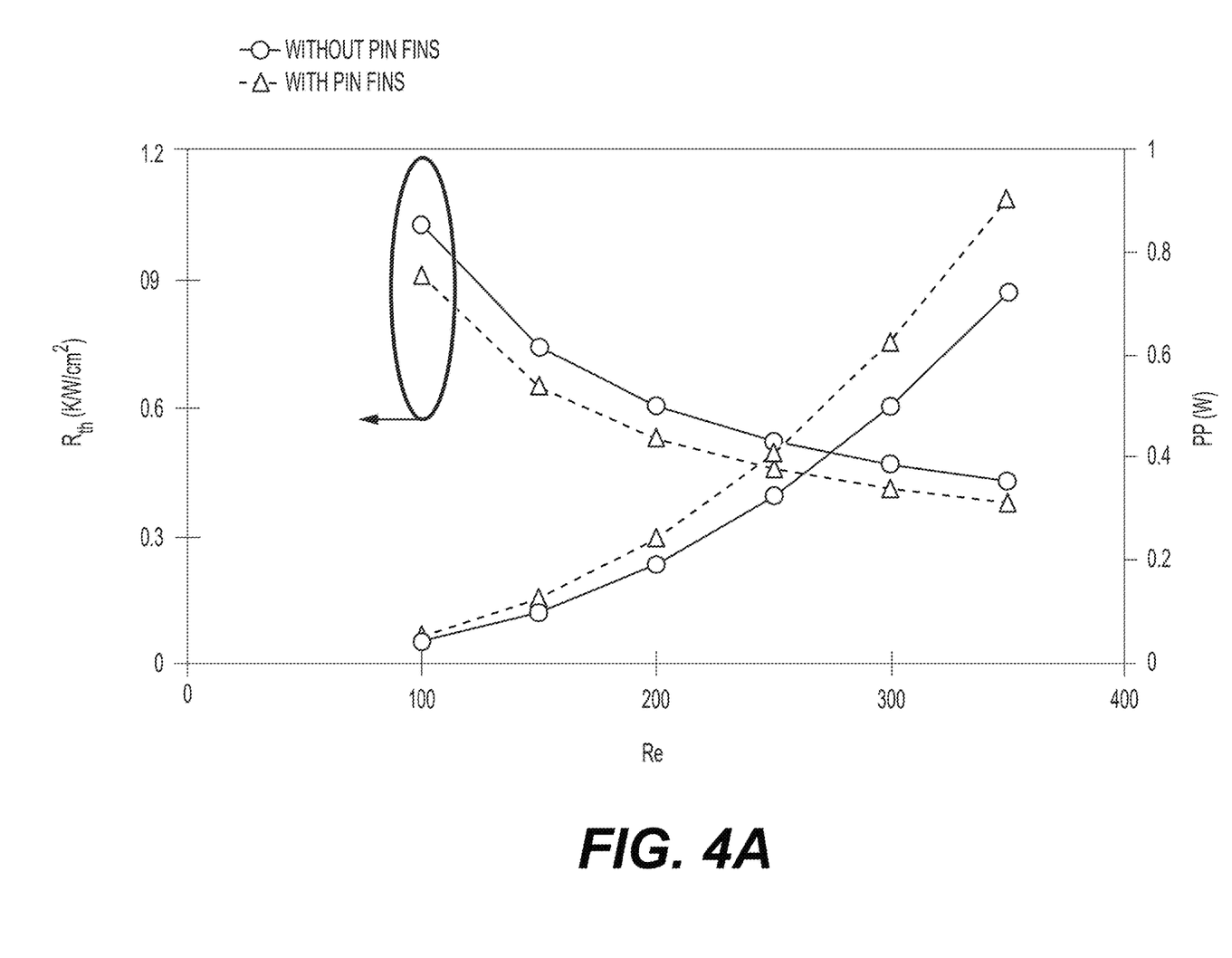
FIG. 4A is a plot showing the variation of total thermal resistance ($R_{th}$) and pumping power (PP) for a range of Reynolds numbers (Re) for the heat sink of FIGS. 1 and 2 compared against a similar heat sink with the circular pin fins of FIG. 3A.
Figure 4B:
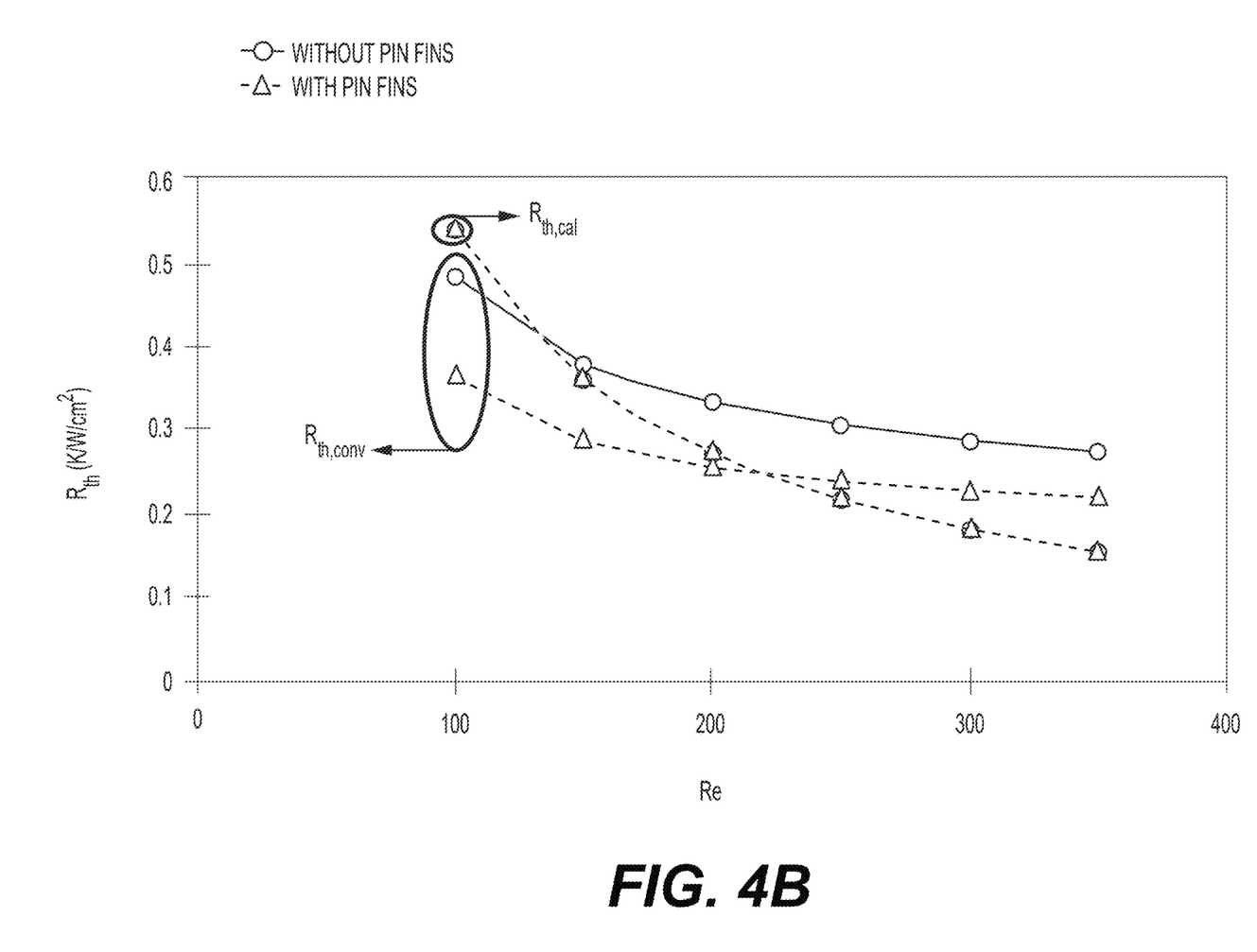
FIG. 4B is a plot showing the variation of the caloric thermal resistance ($R_{th,cal}$) and the convective thermal resistance ($R_{th,conv}$) for a range of Reynolds numbers (Re) for the heat sink of FIGS. 1 and 2 compared against the similar heat sink with the circular pin fins of FIG. 3A.

FIG. 4A is a plot of the variation of total thermal resistance ($R_{th}$) and pumping power (PP) for a range of Reynolds numbers (Re) for heat sink 10 without pin fins (or other flow-disturbing elements) compared against heat sink 10 with circular pin fins 40 mounted on an interior surface of the first circular wall 14 and an interior surface of the second circular wall 16. FIG. 4B is a plot of the variation of the caloric thermal resistance ($R_{th,cal}$) and the convective thermal resistance ($R_{th,conv}$) for a range of Reynolds numbers (Re) for heat sink 10 without pin fins (or other flow-disturbing elements) compared against heat sink 10 with circular pin fins 40 mounted on an interior surface of the first circular wall 14 and an interior surface of the second circular wall 16. As shown, the circular pin fins 40 decrease the thermal resistance of the heat sink 10. Further, it can be seen that the thermal resistance of heat sink 10 decreases with an increase in the Reynolds number.

Figure 5:
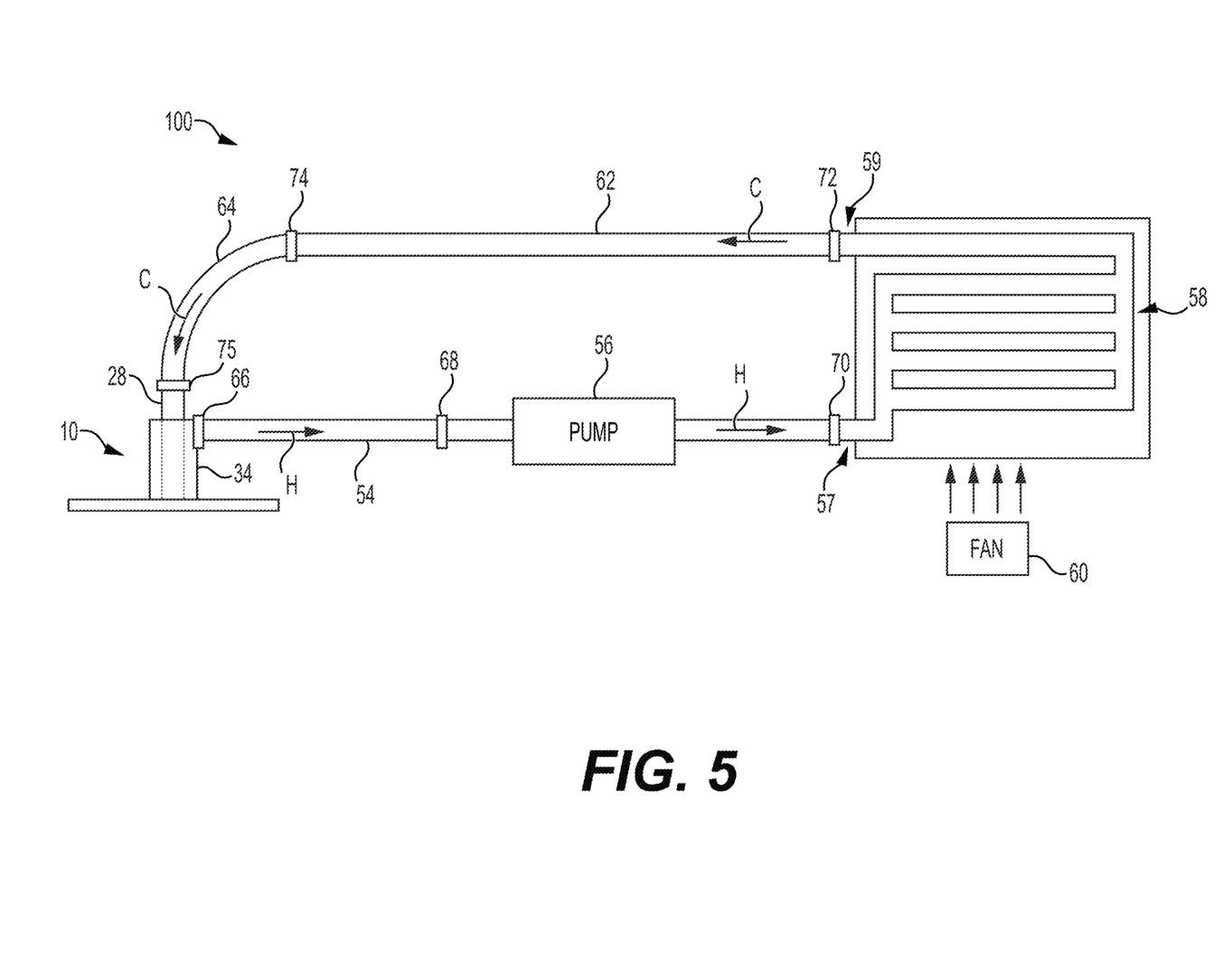
FIG. 5 diagrammatically illustrates a heat exchanger system including the heat sink of FIGS. 1 and 2.

As shown in FIG. 5, the heat sink 10 may be integrated into a heat exchanger system 100 including a heat exchanger, such as, as a non-limiting example, an air-to-liquid heat exchanger 58. An inlet 57 of the air-to-liquid heat exchanger 58 is in fluid communication with the outlet tube 34 of the heat sink 10 for receiving the heated heat exchange liquid H therefrom for cooling thereof. An outlet 59 of the air-to-liquid heat exchanger 58 is in fluid communication with the inlet tube 28 of the heat sink 10 for transferring the cool heat exchange liquid C thereto following cooling thereof in the air-to-liquid heat exchanger 58. A pump 56 or the like may be provided for driving the heat exchange liquid through the air-to-liquid heat exchanger 58, and a fan 60 or the like may be provided for delivering environmental air to the air-to-liquid heat exchanger 58. It should be understood that the heat exchanger system 100 may include any suitable type of connectors and conduits, as are well-known in heat exchange systems. In the non-limiting example of FIG. 5, outlet tube 34 is connected to pump 56 by a pipe, tube or other type of suitable conduit 54. A secure fluid-tight connection is provided by connectors 66, 68, which may be any suitable type of connectors. A similar connector 70 is provided for connecting pump 56 to inlet 57 of the air-to-liquid heat exchanger 58. The outlet 59 of the air-to-liquid heat exchanger 58 may be connected to the inlet tube 28 by at least one pipe, tube or other type of suitable conduit 62, 64, and secure fluid-tight connections are provided by connectors 72, 74 and 75, which may be any suitable type of connectors.

It is to be understood that the heat sink and the heat exchanger system using the same are not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

The invention claimed is:

1. A heat sink, comprising:
a hollow cylindrical housing having first and second opposed circular walls and a sidewall, the first circular wall having a central opening formed therethrough;
an intermediate circular plate positioned between the first and second opposed circular walls, the intermediate circular plate having a central passage and an array of apertures formed therethrough;
an inlet tube having opposed first and second ends, wherein the inlet tube passes through the central opening formed through the first circular wall, and wherein the second end of the inlet tube is in direct fluid communication with the central passage formed through the intermediate circular plate; and
an outlet tube having opposed first and second ends, wherein the second end of the outlet tube is in direct fluid communication with the central opening formed through the first circular wall,
wherein the second circular wall is adapted for thermal communication with a heat source,
wherein the inlet tube delivers a cool heat exchange liquid to a heat exchange chamber defined between the second circular wall and the intermediate circular plate,
wherein the outlet tube removes a heated heat exchange liquid from an outlet chamber defined between the first circular wall and the intermediate circular plate, and
wherein the heat exchange chamber and the outlet chamber are in fluid communication with one another through the array of apertures formed through the intermediate circular plate,
wherein the inlet tube has a diameter which is smaller than a diameter of the outlet tube, and
wherein the inlet tube and the outlet tube are arranged coaxially and concentrically with respect to one another.

2. The heat sink as recited in claim 1, wherein a plurality of pin fins are mounted on an interior surface of the second circular wall.

3. The heat sink as recited in claim 1, wherein a plurality of elongated members are mounted on an interior surface of the first circular wall and an interior surface of the second circular wall such that a plurality of channels are defined therebetween.

4. A heat exchanger system, comprising:
the heat sink according to claim 1; and
an air-to-liquid heat exchanger having an inlet and an outlet, the inlet thereof being in fluid communication with the outlet tube of the heat sink for receiving the heated heat exchange liquid therefrom for cooling thereof, and the outlet thereof being in fluid communication with the inlet tube of the heat sink for transferring the cool heat exchange liquid thereto following cooling thereof.

5. The heat exchanger system as recited in claim 4, further comprising a pump for driving the heated heat exchange liquid and the cool heat exchange liquid through the air-to-liquid heat exchanger.

6. The heat exchanger system as recited in claim 4, further comprising a fan for delivering environmental air to the air-to-liquid heat exchanger.

7. The heat exchanger system as recited in claim 4, wherein a plurality of pin fins are mounted on an interior surface of the first circular wall and an interior surface of the second circular wall of the heat sink.

8. The heat exchanger system as recited in claim 4, wherein a plurality of elongated members are mounted on an interior surface of the first circular wall and an interior surface of the second circular wall of the heat sink such that a plurality of channels are defined therebetween.

9. The heat exchanger system as recited in claim 4, wherein the inlet tube of the heat sink has a diameter which is smaller than a diameter of the outlet tube of the heat sink.

10. The heat exchanger system as recited in claim 9, wherein the inlet tube and the outlet tube of the heat sink are arranged coaxially with respect to one another.

11. The heat sink as recited in claim 1, wherein the second end of the inlet tube is directly connected to the central passage formed through the intermediate circular plate.

12. The heat sink as recited in claim 11, wherein the second end of the outlet tube is directly connected to the central opening formed through the first circular wall.

* * * * *